US012261598B2

(12) United States Patent
Kim et al.

(10) Patent No.: US 12,261,598 B2
(45) Date of Patent: Mar. 25, 2025

(54) LOGIC BASED RING OSCILLATOR COUPLING CIRCUIT

(71) Applicant: Regents of the University of Minnesota, Minneapolis, MN (US)

(72) Inventors: Hyung-il Kim, Minneapolis, MN (US); William Moy, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 15 days.

(21) Appl. No.: 18/349,246

(22) Filed: Jul. 10, 2023

(65) Prior Publication Data

US 2024/0022251 A1   Jan. 18, 2024

Related U.S. Application Data

(60) Provisional application No. 63/429,189, filed on Dec. 1, 2022, provisional application No. 63/389,723, filed on Jul. 15, 2022.

(51) Int. Cl.
*H03K 19/00* (2006.01)
*H03K 3/03* (2006.01)

(52) U.S. Cl.
CPC ....... *H03K 19/0002* (2013.01); *H03K 3/0315* (2013.01)

(58) Field of Classification Search
CPC .................................................. H03K 19/0002
USPC ...................................................... 331/46, 57
See application file for complete search history.

(56) References Cited

U.S. PATENT DOCUMENTS

| 11,545,963 | B1 | 1/2023 | Zick |
| 2011/0090015 | A1* | 4/2011 | Sumita ................. H03K 3/0315 331/56 |
| 2021/0152125 | A1 | 5/2021 | Chou et al. |
| 2021/0312298 | A1 | 10/2021 | Kim et al. |
| 2023/0132603 | A1 | 5/2023 | Kim et al. |
| 2024/0029779 | A1* | 1/2024 | Kuzmenka ........... H03K 3/0315 |

OTHER PUBLICATIONS

Yamaoka, M. "A 20k-Spin Ising Chip to Solve Combinatorial Optimization Problems With CMOS Annealing" IEEE Journal of Solid-State Circuits, vol. 51, No. 1, Jan. 2016, 7pgs.
M. Johnson, et al., "Quantum Annealing with Manufactured Spins," Nature, vol. 473, pp. 194-198, 2011.

(Continued)

*Primary Examiner* — Joseph Chang
(74) *Attorney, Agent, or Firm* — Brian D. Kaul; Westman, Champlin & Koehler, P.A.

(57) ABSTRACT

A coupled ring oscillator circuit includes a first ring oscillator, a second ring oscillator and a coupling circuit. The first ring oscillator includes a series of delay stages, each delay stage including an inverter gate. The second ring oscillator includes a series of delay stages, each delay stage including an inverter gate. The coupling circuit includes a coupling cell having a first modified tri-state inverter connected in parallel with one of the inverter gates of the first ring oscillator, and a second modified tri-state inverter connected in parallel with one of the inverter gates of the second ring oscillator.

8 Claims, 7 Drawing Sheets

(56) References Cited

OTHER PUBLICATIONS

M. Yamaoka, C. Yoshimura, M. Hayashi, T. Okuyama, H. Aoki and H. Mizuno, "A 20k-Spin Ising Chip to Solve Combinatorial Optimization Problems With CMOS Annealing," in IEEE Journal of Solid-State Circuits, vol. 51, No. 1, pp. 303-309, Jan. 2016, doi: 10.1109/JSSC.2015.2498601.

T. Takemoto, M. Hayashi, C. Yoshimura and M. Yamaoka, "2.6 A 2 −30k-Spin Multichip Scalable Annealing Processor Based on a Processing-In-Memory Approach for Solving Large-Scale Combinatorial Optimization Problems," 2019 IEEE International Solid-State Circuits Conference—(ISSCC), San Francisco, CA, USA, 2019, pp. 52-54, doi: 10.1109/ISSCC.2019.8662517.

A. Lucas, "Ising Formulations of Many NP Problems," Front. Phys., vol. 2, No. 5, pp. 1-15, 2014.

M. X., Goemans, et al., "Improved Approximation Algorithms for Maximum Cut and Satisfiability Problems Using Semidefinite Programming," JACM, vol. 42, No. 6, pp. 1115-1145, 1995.

I. Ahmed, et al., "A Probabilistic Self-annealing Compute Fabric based on 560 Hexagonally Coupled Ring Oscillators for Solving Combinatorial Optimization Problems," 2020 IEEE, Dept. of ECE, University of Minnesota, Minneapolis, MN, USA, 2020, 2 pgs.

I. Ahmed, et al., "A Probabilistic Compute Fabric Based on Coupled Ring Oscillators for Solving Combinatorial Optimization Problems," IEEE Journal of Solid-State Circuits, 2021 IEEE, 11 pgs.

U.S. Appl. No. 17/213,396, filed Mar. 26, 2021, entitled "Probabilistic Compute Engine Using Coupled Ring Oscillators", 26 pages.

J. Chou, S. Bramhavar, S. Ghosh, et al., "Analog Coupled Oscillator Based Weighted Ising Machine", Scientific Reports, 2019, 10 pages.

P. Xiao, "Optoelectronics for refrigeration and analog circuits for combinatorial optimization" Electrical Engineering and Computer Sciences, University of California at Berkeley, Technical Report No. UCB/EECS-2019-74, http://www2.eecsberkeley.edu/Pubs/TechRpts/2019/EECS-2019-74.html. May 17, 2019, 155 pgs.

\* cited by examiner

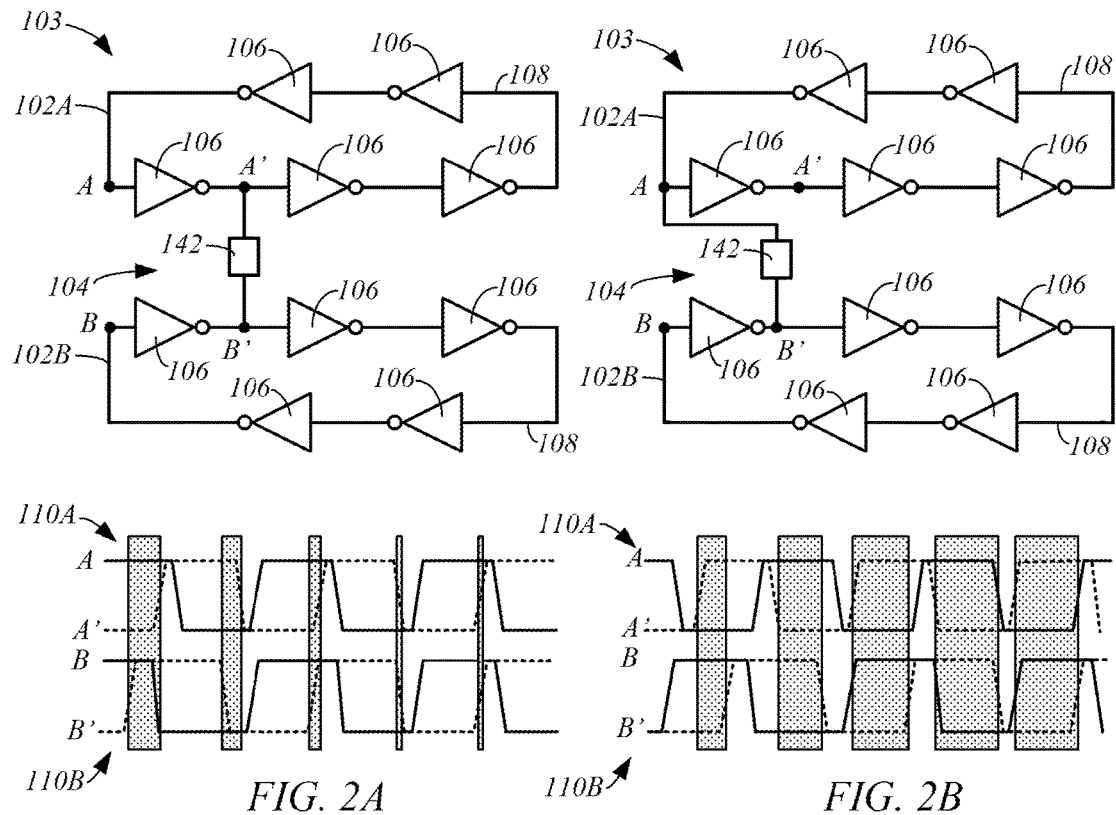
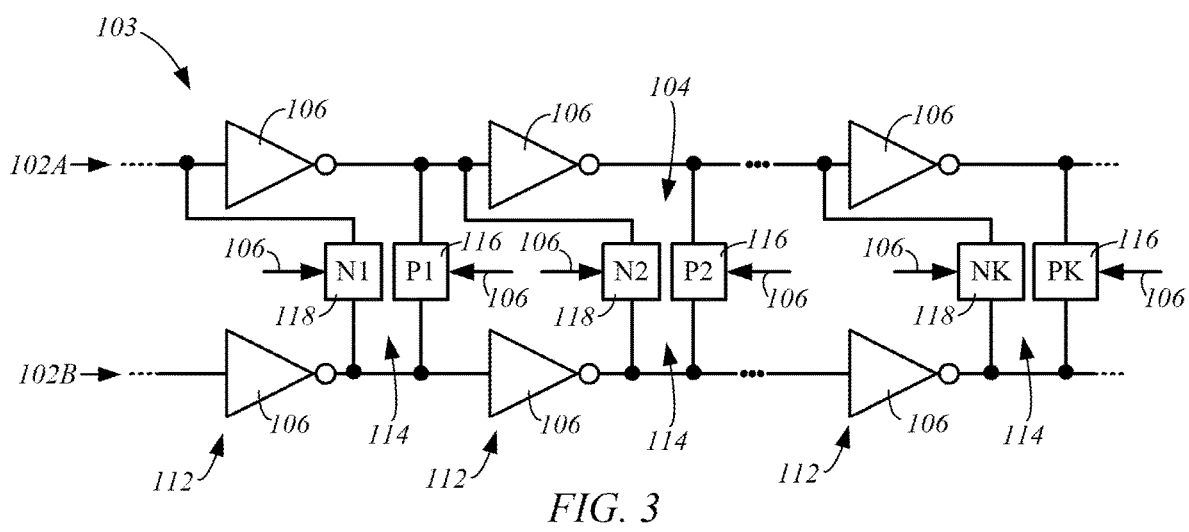

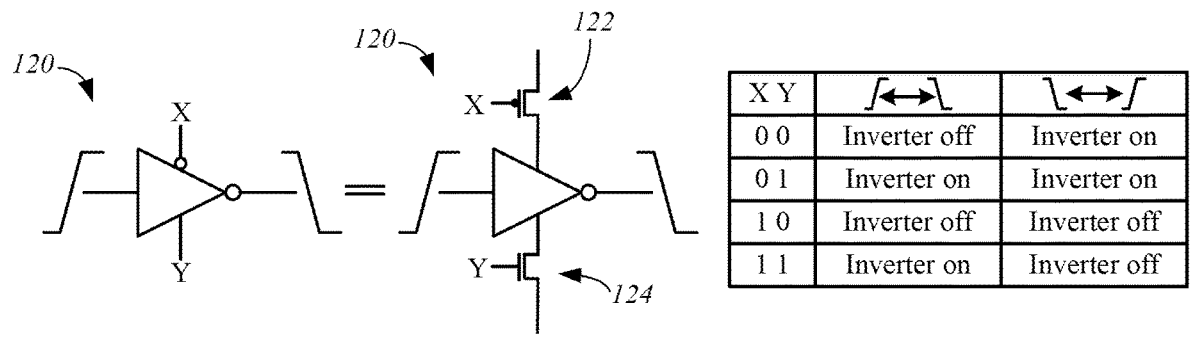
FIG. 4
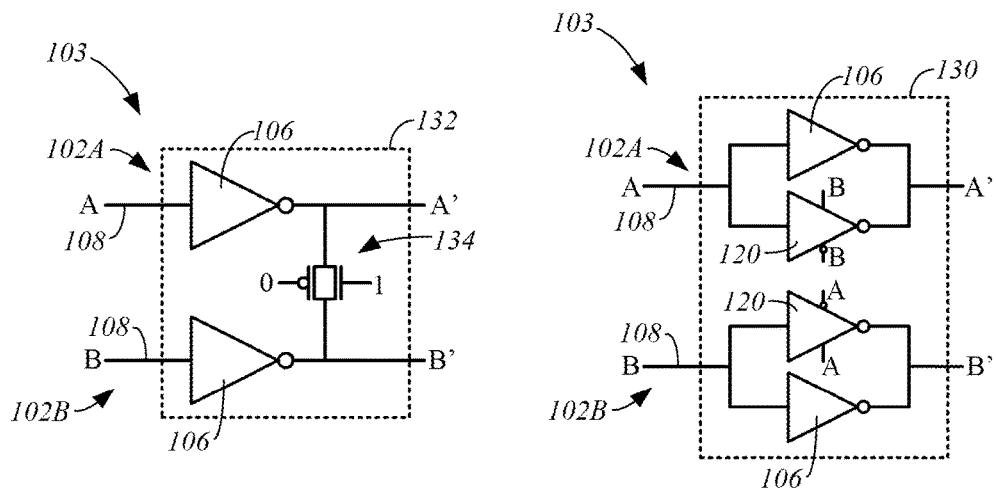
FIG. 5
FIG. 6

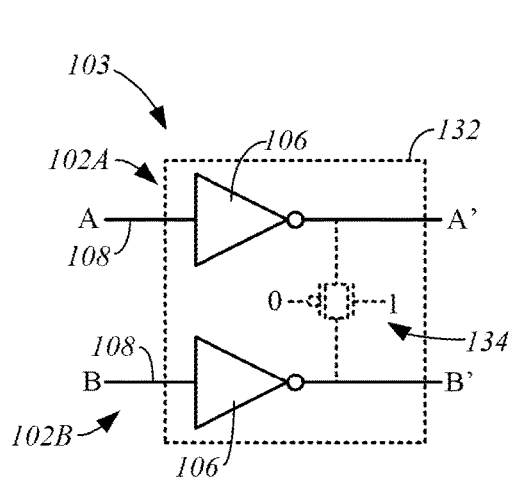
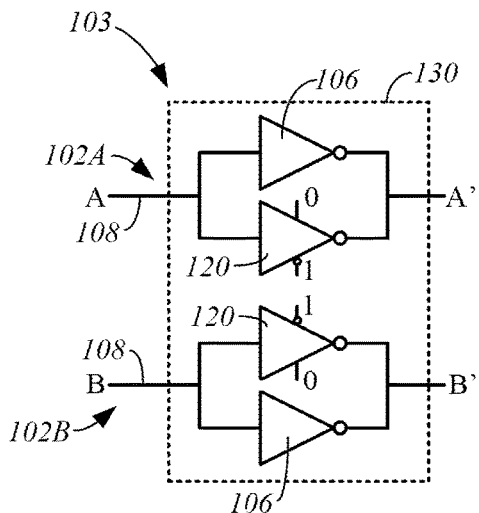
| A | B / B' | Delay(A) |
|---|---|---|
| 0→1 | 0 / 1 | $T_{nom}$ |
| 0→1 | 1 / 0 | $T_{nom}$ |
| 1→0 | 0 / 1 | $T_{nom}$ |
| 1→0 | 1 / 0 | $T_{nom}$ |
FIG. 9
| A | B / B' | Delay(A) |
|---|---|---|
| 0→1 | 0 / 1 | $T_{nom}$ |
| 0→1 | 1 / 0 | $T_{nom}$ |
| 1→0 | 0 / 1 | $T_{nom}$ |
| 1→0 | 1 / 0 | $T_{nom}$ |
FIG. 10
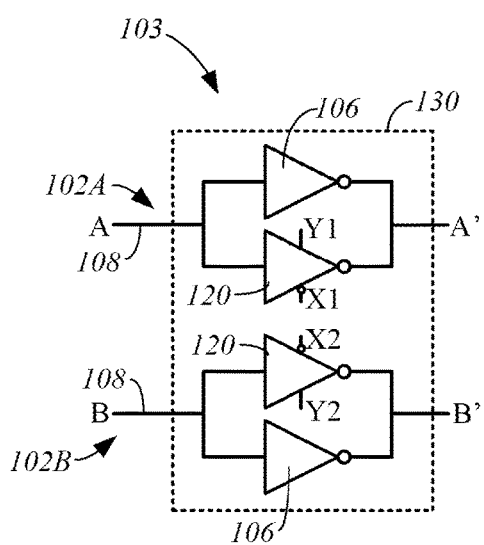
| Coupling Weight | X1 | Y1 | X2 | Y2 |
|---|---|---|---|---|
| +1 | B | B | A | A |
| −1 | B' | B' | A' | A' |
| 0 | 1 | 0 | 1 | 0 |
FIG. 11

LOGIC BASED RING OSCILLATOR COUPLING CIRCUIT

CROSS-REFERENCE TO RELATED APPLICATIONS

The present application is based on and claims the benefit of U.S. provisional patent application Ser. No. 63/389,723, filed Jul. 15, 2022, and U.S. provisional patent application Ser. No. 63/429,189, filed Dec. 1, 2022. The content of each of the above-referenced applications is hereby incorporated by reference in its entirety.

FIELD

The present disclosure relates to coupling circuits that may be used to drive oscillating signals of a pair of ring oscillators to oscillate more in phase or out of phase with each other and, more specifically, to logic based coupling circuits.

BACKGROUND

Combinatorial optimization problems (COPs), such as Boolean satisfiability, traveling salesman, and max-cut, are a class of nondeterministic polynomial-time hardness problems that are intractable to solve using a traditional computer due to the extremely large search space. Artificial intelligence decision making, vehicle routing, very large-scale integration layout optimization, network design, and many other modern applications can be modeled as COPs.

One promising approach to solving COPs involves transforming the COP into the Ising spin glass model, in which the COP is mapped to a network of spins. According to this approach, a graph representing a COP is formed, an example of which (graph 300) is illustrated in FIG. 13A. The graph 300 is then mapped to a network of spins 302, such as illustrated in FIG. 13B. In the mapping or network 302, the spins 304 represent the vertices 306 of the graph 300, and the couplings 308 between the spins 304 represent the edges 310 of the graph.

The COP is solved by letting the network naturally find its minimum energy state through coupling dynamics. Ideally, the energy of the system represented by the network 302 reaches the ground state or global minima 312 (FIG. 13C) based on the coupling of the spins 304, which is the solution of the COP. However, the system represented by the network 302 may get stuck in some local minima 314 along the way, requiring an annealing mechanism to escape from the sub-optimal solution.

The states of all the spins 304 (e.g., 1 for up-spin and −1 for down-spin) in the network 302 determine the Ising Hamiltonian function, which denotes the total energy of the system represented by the network 302, and is the solution to the COP.

Coupled ring oscillators have been used in compute engine circuitry to represent spin networks, such as discussed in U.S. Publication No. 2021/0312298. As discussed in the above-referenced applications, circuits providing 100's of all-to-all coupled ring oscillators or more may be used to represent spin networks. These circuits require coupling circuits that can induce a positive or negative coupling between the oscillating signals of connected pairs of ring oscillators. Positive coupling encourages the oscillating signals to oscillate in the same phase, whereas negative coupling encourages the oscillating signals to oscillate in the opposite phase (i.e., 180 degrees phase difference).

It is desirable for the coupling circuits to have a programmable coupling strength, operate reliably under process-voltage-temperature variation, and have negligible static power consumption. In circuits where each ring oscillator must be connected to each of the other ring oscillators through a coupling circuit, the number of coupling circuits increases as $N^2$ where N is the number of ring oscillators. In order to scale up the design to 100's or 1000's of ring oscillators, it is imperative to reduce the power consumption of each coupling circuit, particularly if the circuitry is to be provided in an integrated circuit chip. For instance, a medium size coupled ring oscillator network with 100 oscillators requires 100×99=9,900 coupling circuits which necessitates an extremely low power coupling circuit with ideally no static power consumption.

SUMMARY

Embodiments of the present disclosure are related to logic based coupling circuits for forming a coupled ring oscillator circuit that connects a pair of ring oscillators. In one embodiment, the coupled ring oscillator circuit includes a first ring oscillator, a second ring oscillator and a coupling circuit. The first ring oscillator includes a series of delay stages, each delay stage including an inverter gate. The second ring oscillator includes a series of delay stages, each delay stage including an inverter gate. The coupling circuit includes a coupling cell having a first modified tri-state inverter connected in parallel with one of the inverter gates of the first ring oscillator, and a second modified tri-state inverter connected in parallel with one of the inverter gates of the second ring oscillator.

Another example of the coupled ring oscillator circuit includes a first ring oscillator, a second ring oscillator and a coupling circuit. The first ring oscillator includes a series of first delay stages, each first delay stage including an inverter gate. The second ring oscillator includes a series of second delay stages, each second delay stage including an inverter gate. The coupling circuit includes a coupling cell for each pair of the first and second delay stages, each coupling cell including a first modified tri-state inverter connected in parallel with the inverter gate of the first delay stage, and a second modified tri-state inverter connected in parallel with the inverter gate of the second delay stage.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

FIGS. 2A and 2B are simplified diagrams of an example of a coupled ring oscillator circuit, in which positive and negative coupling weights are applied, respectively.

FIG. 3 is a simplified diagram of an example of a coupled ring oscillator circuit.

FIG. 4 includes a schematic diagram an example of a modified tri-state inverter and a truth table for the modified tri-state inverter, in accordance with embodiments of the present disclosure.

FIG. 5 includes a simplified diagram of an example of a coupled ring oscillator circuit having a transmission gate type coupling cell and a corresponding truth table.

FIG. 6 includes a simplified diagram of an example of a coupled ring oscillator circuit having a logic based coupling cell and a corresponding truth table, in accordance with embodiments of the present disclosure.

FIG. 9 includes a simplified diagram of an example of a coupled ring oscillator circuit having a transmission gate type coupling cell and a corresponding truth table.

FIG. 10 includes a simplified diagram of an example of a coupled ring oscillator circuit having a logic based coupling cell and a corresponding truth table, in accordance with embodiments of the present disclosure.

FIG. 11 illustrates an example of a programmable logic based coupling cell and corresponding four modified tri-state inverter control signals for providing a positive weight coupling mode, a negative weight coupling mode and a zero weight coupling mode, in accordance with embodiments of the present disclosure.

DETAILED DESCRIPTION OF ILLUSTRATIVE EMBODIMENTS

Figure 1:
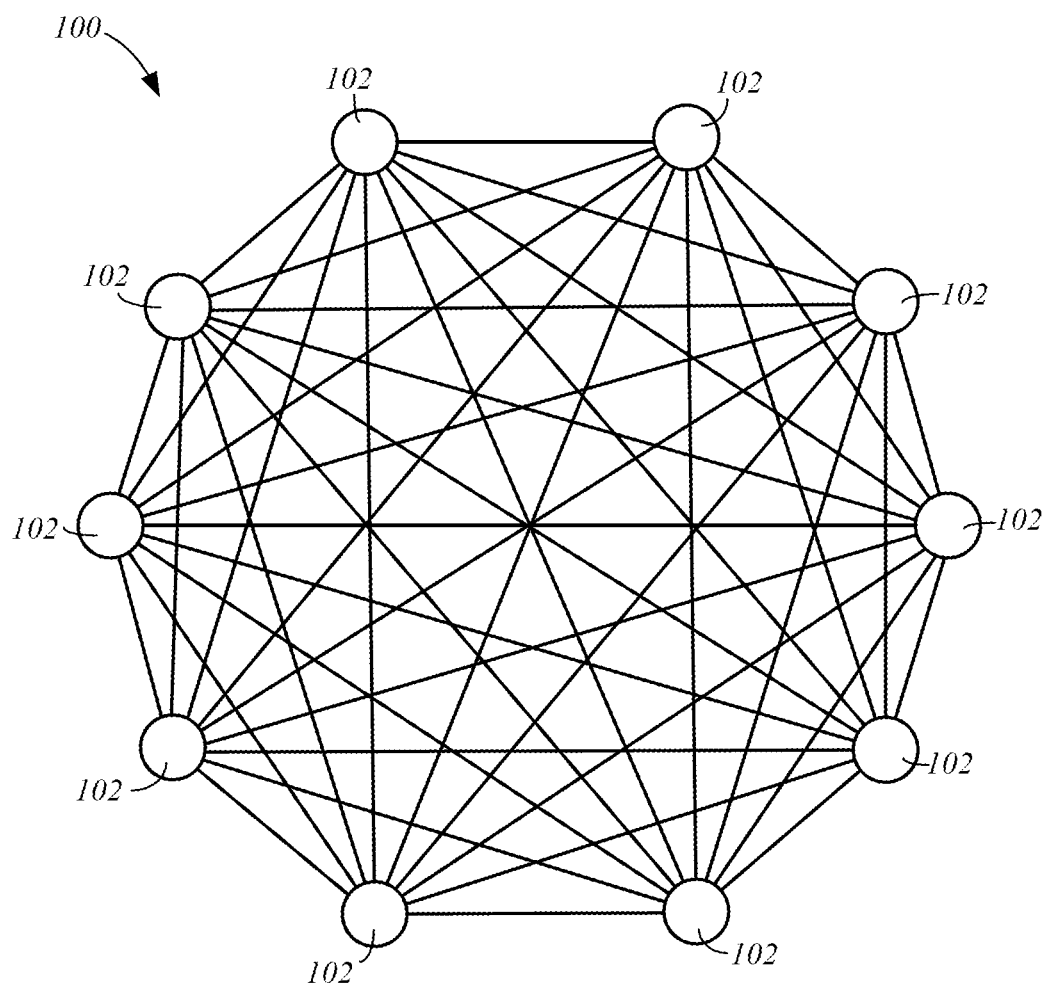
FIG. 1 is a simplified diagram of a spin network mapping represented by coupled ring oscillators.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Specific details are given in the following description to provide a thorough understanding of the embodiments. However, it is understood by those of ordinary skill in the art that the embodiments may be practiced without these specific details. For example, circuits, systems, networks, processes, frames, supports, connectors, motors, processors, and other components may not be shown, or may be shown in block diagram form in order to not obscure the embodiments in unnecessary detail.

Unless otherwise defined, all terms (including technical and scientific terms) used herein have the same meaning as commonly understood by one of ordinary skill in the art relating to the present disclosure. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present disclosure are related to logic based coupling circuits for use in providing a weighted connection between a pair of oscillating devices, such as ring oscillators. The logic based coupling circuits substantially or completely eliminate static power consumption and signal margin issues over transmission gate based coupling circuits. In general, the coupling weight circuit design of the present disclosure utilizes fully digital delay shifting gates that consume little, if any static power and employ full-swing digital signals (i.e., no signal margin issues).

Unlike the previous transmission gate coupling weight circuit designs, the logic based coupling circuit design of the present disclosure has no contention current while still being able to lock two oscillating signals into the same or opposite phases. The only power consumed in the logic based coupling circuit is the switching power during the signal transition and the device leakage current. Another important benefit is the fact that all signals in the circuit are fully digital which makes the overall design robust against process-voltage-temperature variations.

As mentioned above, ring oscillators may be used to represent a spin network mapping for solving combinatorial optimization problems (COPs), such as the ground state of a cost function representing a hard optimization problem, for example. FIG. 1 is a simplified diagram of an example of a spin network mapping 100 represented by a group of 10 ring oscillators 102. Each ring oscillator 102 produces an oscillating signal, the phase of which may represent a "spin". The ring oscillators 102 are connected to each other through a weighted coupling represented by the lines extending between the ring oscillators.

Coupling circuits form the weighted couplings between the ring oscillators 102 and apply either a positive or negative weighting to represent the desired spin network mapping. When the oscillating signals of two ring oscillators 102 are coupled with a positive coupling weight, their oscillating signals or spin states will tend to resolve to the same phase or spin state as this minimizes the energy, and when two ring oscillators 102 are coupled with a negative coupling weight, their oscillating signals or spin states will tend to resolve to the opposite phase or spin state to minimize the energy.

In general, the weighted coupling applied by a coupling circuit between a pair of ring oscillators 102 manipulates a delay of the oscillating signals traveling through the ring oscillators 102 such that the two coupled nodes eventually lock into the same or opposite phases depending on the coupling polarity. An example of this is illustrated in FIGS. 2A and 2B. FIG. 2A is a simplified diagram of a coupled ring oscillator circuit 103, in which a coupling circuit 104 provides a positive weighted coupling between a pair of ring oscillators 102A and 102B. FIG. 2B is a simplified diagram of a coupled ring oscillator circuit 103, in which a coupling circuit 104 provides a negative weighted coupling between the pair of ring oscillators 102A and 102B.

In this example, each of the ring oscillators 102A and 102B comprises a series of inverter gates 106 (e.g., CMOS inverter circuit) that forms an oscillating loop 108 through which an oscillating signal travels. Below each coupled ring oscillator circuit 103 are waveforms illustrating an evolution of the oscillating signals 110A and 110B of the ring oscillators 102A and 102B at nodes of the circuit over time after the activation of the coupling circuit 104. The shaded boxes overlaying the waveforms illustrate the amount the oscillating signals 110 are out of phase with each other.

The coupling circuits shown in FIGS. 2A and 2B may take the form of transmission gates formed using p-type and n-type transistors. The activation of the coupling circuit 104 in FIG. 2A, connects the nodes A' and B' together. If the oscillating signal 110B at B' switches slightly earlier than the oscillating signal 110A at A', the switching of signal 110B at B' is impeded by the state of signal 110A at A' while the switching of the signal 110A at A' is accelerated by the state of signal 110B at B', until the two coupled oscillating signals at A' and B' are synchronized to the same phase. In the case that the signal 110A at A' overtakes and passes the signal 110B at B', then the opposite signals are impeded or accelerated which brings the two signal edges back closer to each other and more in phase. Similarly, if the nodes A and B' are negatively coupled, as shown in FIG. 2B, the oscillating signal 110A at the node A' and the signal 110B at the node B' will be driven toward opposite phases, and ultimately results in the signals having opposite phases, as shown in the corresponding waveform.

To provide a representation of a spin network mapping of real optimization problems, the coupling strength between two oscillators must be programmable with multi-bit resolution. This can be achieved by using coupling circuits having a chain of coupling cells that are matched to delay stages of the connected ring oscillators. Each coupling cell may be configured to shift the delay of each delay stage in response to control signals. One example of this is illustrated in the simplified diagram of a coupled ring oscillator circuit 103 provided in FIG. 3.

The ring oscillators 102A and 102B include a plurality (e.g., K) of corresponding delay stages 112, each formed by an inverter gate 106. In this example, the coupling circuit 104 includes a plurality coupling stages 114, each including a positive coupling 116 (P1, P2, . . . Pk) and a negative coupling 118 (e.g., N1, N2, . . . Nk) in the form of transmission gates. Each positive coupling 116 may be configured to connect nodes at the outputs of the inverter gates 106 of the corresponding delay stages 112 to each other to couple the same phase signals of the ring oscillators 102A and 102B together, and each negative coupling 118 may be configured to connect a node at an input to an inverter gate 106 of the oscillator loop 102A to a node at the output of the corresponding inverter gate 106 of the oscillator loop 102B to couple the opposite phase signals of the ring oscillators 102A and 102B.

This arrangement allows for the programmed application of various coupling weights having a positive or negative polarity. When none of the positive or negative weight couplings 116 and 118 are activated, a weight of W=0 is applied to the ring oscillator loops 102A and 102B. Positive weights may be applied through the enablement of one or more of the positive weight couplings 116. For example, a weight of W=+1 may be applied when only one positive weight coupling 116 (e.g., P1) is enabled, a weight of W=+2 may be applied when two of the positive weight couplings 116 are enabled (e.g., P1 and P2), and so on. Likewise, negative weights may be applied through the enablement of one or more of the negative weight couplings 118. Thus, a weight of W=−1 may be applied to the loops when only one negative weight coupling 118 (e.g., N1) is enabled, a weight of W=−2 may be applied to the loops when two of the negative weight couplings 118 are enabled (e.g., N1 and N2), and so on. Accordingly, the range of weights that may be applied is scalable based on the number of coupling stages. Accordingly, a coupling circuit 104 having, for example, seven coupling stages 112 may apply coupling weights of W=−7 to W=+7.

The cascaded circuit architecture has the advantage of each stage providing the same delay shift which ensures that the effective coupling strength is proportional to the number of enabled transmission gates. Moreover, the regular layout of each coupling stage reduces the impact of process, voltage, and temperature variation on the coupling uniformity.

As mentioned above, is desirable to minimize the static current that is consumed in each delay stage by the coupling circuits, such as when the coupled node voltages are held at opposite voltage levels. Since the signal levels are held constant for most of the cycle and the signal switching occurs only once every half cycle, from a low power design perspective, the use of transmission gates, such as parallelly connected p-type and n-type transistors, for the coupling stages 114 would be highly inefficient. For example, the use of such transmission gates would cause an enormous amount of static current to be consumed, which would dominate the total chip power for large all-to-all connected ring oscillators, such as those comprising hundreds of oscillators.

Embodiments of the present disclosure relate to a coupling circuit design that solves the power consumption issue of the transmission gate-based couplers. One embodiment of the coupling circuit takes the form of a "logic based" coupling circuit that dissipates zero static power, through the implementation of the coupling circuit using standard logic gates formed using complementary metal-oxide-semiconductor (CMOS) technology. As a result, the logic based coupling circuit may be formed using standard building blocks of digital chips.

Advantages of the logic based coupling circuit of the present disclosure over transmission gate based coupling circuits will be described with reference to FIGS. 4-10. FIG. 4 includes a schematic diagram of an example of a modified tri-state inverter 120 that includes a p-type header 122 and an n-type footer 124 with separate control signals X and Y. Note that this is slightly different from a standard tri-state inverter where the inputs are not controlled independently as in the modified tri-state inverter 120 but are complementary signals. The modified tri-state inverter 120 can be turned on or off for different input/output signal switching directions by applying the appropriate X and Y signals. For instance, when X=0 and Y=0, only the p-type header 122 is turned on which activates the inverter during pull-up mode. During pull-down mode, the inverter 120 is effectively off since the n-type footer is turned off by the Y=0 signal. Other cases such as X=0 and Y=1 can be understood in the same way. The operation truth table of the modified tri-state inverter 120 is shown next to the schematic diagram in FIG. 4.

Using the modified tri-state inverter 120, we can construct a logic based coupling circuit for applying a weighted coupling between corresponding delay stages of a pair of coupled ring oscillators. FIGS. 5-10 are schematic diagrams illustrating a comparison of logic based coupling cells 130 of a logic based coupling circuit in accordance with embodiments of the present disclosure, and a transmission gate type coupling cell 132. The transmission gate type coupling cell 132 may be formed using p-type and n-type transistors, as mentioned above. One objective is to make the logic-gate type coupling cells 130 behave the same way as the conventional transmission gate type coupling cells 132, which have been proven to work but consume static power even when no switching occurs.

FIGS. 5 and 6 respectively illustrate an example of the application of a positive coupling (weight=+1) using a transmission gate type coupling cell 132 and a logic based coupling cell 130, which is in accordance with embodiments of the present disclosure. For the transmission gate type coupling cell 132, the outputs of the two inverters of the ring oscillators 102A and 102B are connected through a transmission gate 134 which modulates the delay of the oscillating loops 108 according to the included delay truth table. This operation causes the oscillating signals of the two oscillating loops to lock together and eventually have the same phases.

The same delay control can be realized using the logic gate based coupling cell 130, in which a modified tri-state inverter 120 is connected in parallel with the corresponding baseline inverter 106 of each ring oscillator 102A and 102B. For the positive coupling, the two control signals of the tri-state inverter 120 are connected to node B for the upper path and node A for the lower path. As indicated in the delay truth table for the logic based coupling cell 130, the imposed delay is effectively the same as that of the transmission gate coupling cell 132 with the exception that the two delay levels are a nominal time (Tnom) and the nominal time less a delta time period (Tnom−Δ), as opposed the nominal time plus a delta time period (Tnom+Δ) and the nominal time less a delta time period (Tnom−Δ) in the case of the transmission gate coupling cell 132.

Figure 7:
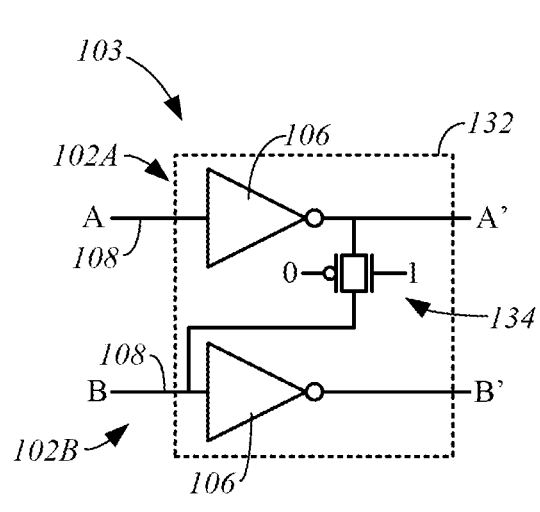
FIG. 7 includes a simplified diagram of an example of a coupled ring oscillator circuit having a transmission gate type coupling cell and a corresponding truth table.
Figure 8:
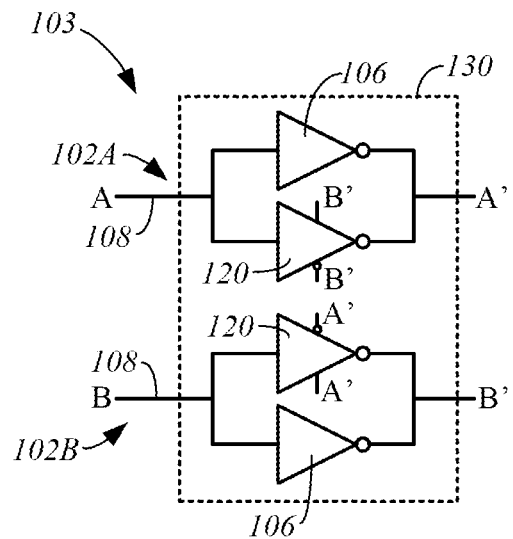
FIG. 8 includes a simplified diagram of an example of a coupled ring oscillator circuit having a logic based coupling cell and a corresponding truth table, in accordance with embodiments of the present disclosure.

The negative coupling cases (weight=−1) for the transmission gate coupling cell 132 and the logic based coupling cell 130 are respectively shown in FIGS. 7 and 8. Here, the transmission gate type coupling cell 132 is connected to the opposite phase node, as discussed above. In the logic based coupling cell 130, the tri-state control signals are connected to B' for the upper path and A' for the lower path. As shown in the delay truth tables, the imposed delay by the logic gate coupling cell 130 is again effectively the same as that of the transmission gate coupling cell 132 with the exception that the two delay levels for the logic based coupling cell 130 are the nominal time less a delta time period (Tnom−Δ) and the nominal time (Tnom), whereas the delay levels of the transmission gate coupling cell 132 are the nominal time less a delta time period (Tnom−Δ) and the nominal time plus a delta time period (Tnom+Δ).

Finally, the no coupling case (weight=0) for the transmission gate coupling cell 132 and the logic based coupling cell 130 are respectively shown in FIGS. 9 and 10. Here, the transmission gate 134 is turned off. The equivalent action is performed in the logic gate coupling cell 130 by turning off the modified tri-state inverter 120 using controls signals to 1 and 0, as indicated in FIG. 10. This results in only the nominal delay as indicated by the delay truth tables.

FIG. 11 illustrates the programmable logic based coupling cell 130 and corresponding four modified tri-state inverter control signals for providing the positive weight coupling mode, the negative weight coupling mode and the zero weight coupling mode. A simple digital logic can be designed to switch between the three coupling modes based on the desired coupling weight value.

Figure 12:
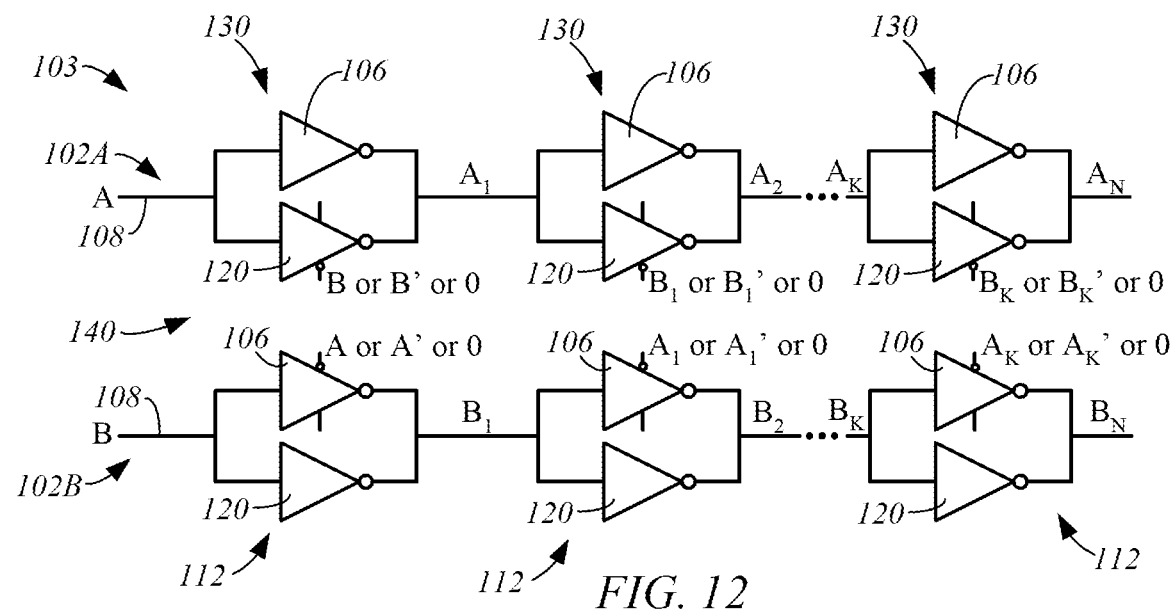
FIG. 12 illustrates an example of a coupled ring oscillator circuit having multiple logic based coupling cells, in accordance with embodiments of the present disclosure.
Figure 13A:
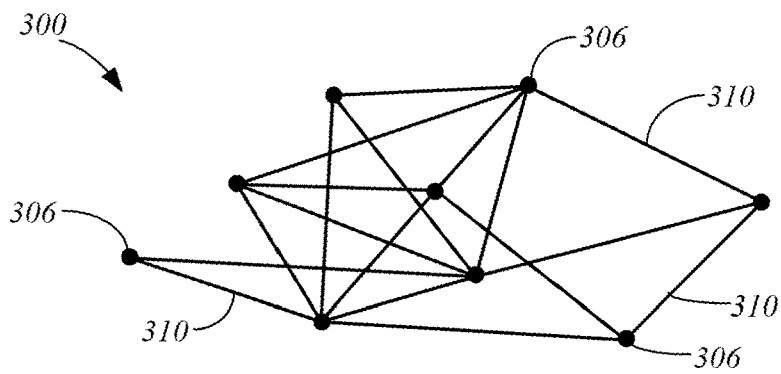
FIGS. 13A-C respectively illustrate examples of a graph representing a COP, a network of spins representing the graph, and a chart illustrating energy of the network, which are used to solve the COP.
Figure 13B:
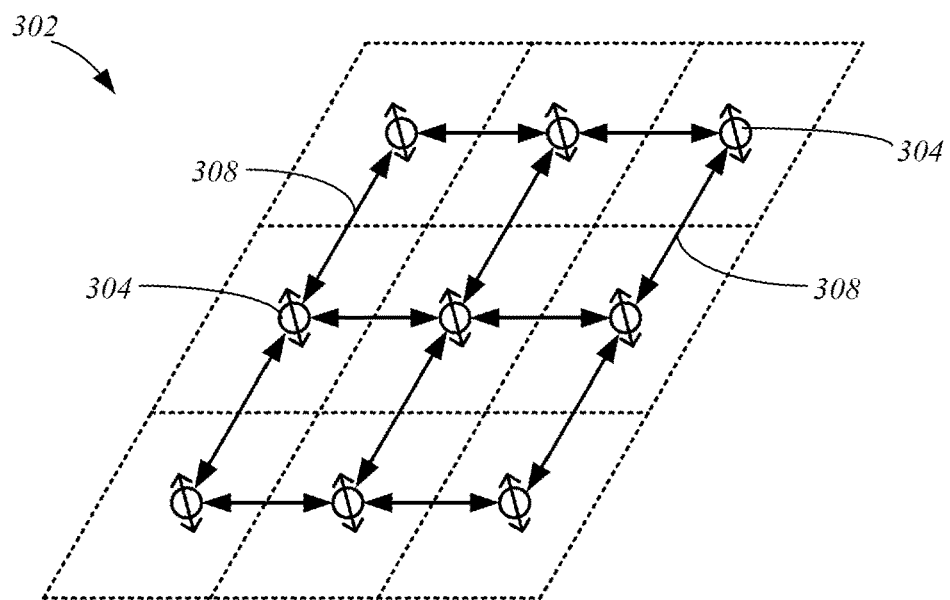
Figure 13C:
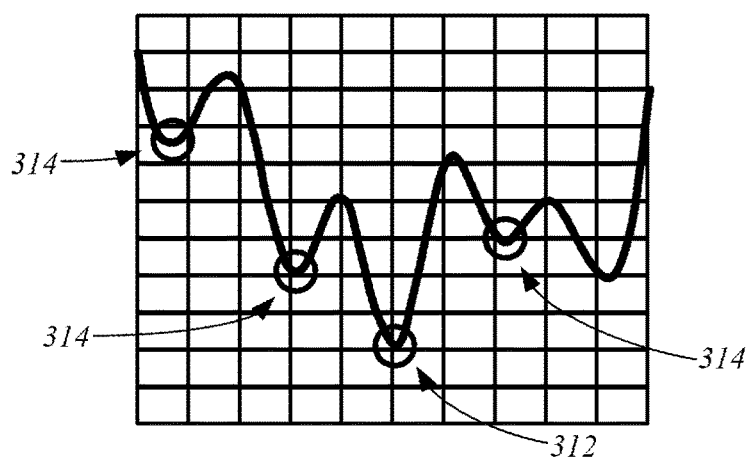

FIG. 12 illustrates a coupled ring oscillator circuit 103 having multiple logic based coupling cells 130 that form a multi-bit version of a logic based coupling circuit 140, in accordance with embodiments of the present disclosure. As above, the ring oscillators 102A and 102B may comprise a series of N delay stages 112 each containing an oscillating element, such as CMOS inverter gate or circuit 106. The logic based coupling circuit 140 for applying a programmable weight coupling between the ring oscillators 102A and 102B includes a plurality of the logic based coupling cells 130, each including a modified tri-state inverter 120 that is connected in parallel with the corresponding inverter gate 106.

The number of logic based coupling cells 130 determines the maximum positive or negative coupling weights that may be applied. In the example circuit of FIG. 12, a logic based coupling cell 130 is provided at each delay stage 112, thus the maximum positive coupling weight is +N and the maximum negative coupling weight is −N. However, it is understood that the coupling circuit 140 may include fewer logic based coupling cells 130 than there are delay stages 112.

The enable signals of the tri-state inverters 120 of each logic based coupling cell 130 is programmable to support the three different coupling modes; namely positive coupling (FIG. 6), negative coupling (FIG. 8), and no coupling (FIG. 10). As discussed above, a positive weight coupling (weight=+1) may be applied when the inputs to the modified tri-state inverters 120 of a coupling cell 130 are the input signal to the inverter gate 106 of the opposing ring oscillator, a negative weight coupling (weight=−1) may be applied when the inputs to the modified tri-state inverters 120 of a coupling cell 130 are the inversion of the input signal to the inverter gate 106 of the opposing ring oscillator, and no coupling weight (weight=0) may be applied by the coupling cell 130 by applying a logic 1 to the inverting input and a logic 0 to the non-inverting input of each modified tri-state inverter 120.

Thus, when the inputs to the tri-state inverter 120 of the first coupling cell 130 connected to the ring oscillator 102A is B, and the input to the tri-state inverter 120 of the first coupling cell 130 connected to the ring oscillator 102B is A, a positive coupling weight (weight=+1) is applied. Additionally, this positive coupling weight may be applied by each of the logic based coupling cells 130 at each delay stage 112 of the ring oscillators in a similar manner. Accordingly, a maximum positive coupling weight of +N may be applied in the example circuit 103 shown in FIG. 12.

When the inputs to the tri-state inverter 120 of the first coupling cell 130 connected to the ring oscillator 102A is B', and the input to the tri-state inverter 120 of the first coupling cell 130 connected to the ring oscillator 102B is A', a negative coupling weight (weight=−1) is applied. Additionally, this negative coupling weight may be applied by each of the logic based coupling cells 130 at each delay stage 112 of the ring oscillators in a similar manner. Accordingly, a maximum negative coupling weight of −N may be applied in the example circuit 103 shown in FIG. 12.

Accordingly, the logic based coupling cells and circuits formed in accordance with embodiments of the present disclosure provide significant advantages over transmission gate based coupling circuits while providing the same functionality. These include zero static power consumption, which enables the logic based coupling circuit to be used in large scale coupled oscillator circuits and chips. Additionally, since all of the signals in the logic based coupling circuit are fully digital, the overall design is highly robust against process-voltage-temperature variations.

Embodiments of the logic based coupling circuit may be used to couple oscillating devices, such as ring oscillators, in the manner described above for the purpose of representing a spin network mapping. The logic based coupling circuit may also be used to couple oscillating devices in other applications. For example, radio receivers often utilize multiple signal phases (e.g., 0 degrees, 90 degrees, 180 degrees and 270 degrees) to down converter signals. When such radio receivers utilize N-path mixers, the number phases required increases to 16 or more. The coupling circuit formed in accordance with the present disclosure may be used to couple the oscillators of such a receiver with no power. Accordingly, the coupling circuit may be used in this and other applications where there is a need to couple oscillating devices.

Although the embodiments of the present disclosure have been described with reference to preferred embodiments, workers skilled in the art will recognize that changes may be made in form and detail without departing from the spirit and scope of the present disclosure.

What is claimed is:

1. A coupled ring oscillator circuit comprising:
   a first ring oscillator comprising a series of delay stages, each delay stage including an inverter gate;
   a second ring oscillator comprising a series of delay stages, each delay stage including an inverter gate; and
   a coupling circuit including a coupling cell comprising:
   a first modified tri-state inverter connected in parallel with one of the inverter gates of the first ring oscillator; and
   a second modified tri-state inverter connected in parallel with one of the inverter gates of the second ring oscillator.

2. The coupled ring oscillator circuit of claim 1, wherein:
   the first modified tri-state inverter is configured to receive a first control signal and a second control signal;
   the second modified tri-state inverter is configured to receive a third control signal and a fourth control signal;
   the coupling cell applies a positive coupling weight to the ring oscillators when the first and second control signals match an input to the inverter gate of the second ring oscillator, and the third and fourth control signals match an input to the inverter gate of the first ring oscillator; and
   the coupling cell applies a negative coupling weight to the ring oscillators when the first and second control signals match an inversion of the input to the inverter gate of the second ring oscillator, and the third and fourth control signals match an inversion of the input to the inverter gate of the first ring oscillator.

3. The coupled ring oscillator circuit of claim 2, wherein the coupling cell does not apply a weight to the ring oscillators when the first and second control signals deactivate the first modified tri-state inverter, and the third and fourth control signals deactivate the second modified tri-state inverter.

4. The coupled ring oscillator circuit of claim 2, wherein:
   the first and second control signals are generated by the second ring oscillator; and
   the third and the fourth control signals are generated by the first ring oscillator.

5. A coupled ring oscillator circuit comprising:
   a first ring oscillator comprising a series of first delay stages, each first delay stage including an inverter gate;
   a second ring oscillator comprising a series of second delay stages, each second delay stage including an inverter gate; and
   a coupling circuit comprising a coupling cell for each pair of the first and second delay stages, each coupling cell comprising:
   a first modified tri-state inverter connected in parallel with the inverter gate of the first delay stage; and
   a second modified tri-state inverter connected in parallel with the inverter gate of the second delay stage.

6. The coupled ring oscillator circuit of claim 5, wherein in each coupling cell:
   the first modified tri-state inverter is configured to receive a first control signal and a second control signal;
   the second modified tri-state inverter is configured to receive a third control signal and a fourth control signal;
   the coupling cell applies a positive coupling weight to the connected ring oscillators when the first and second control signals match an input to the inverter gate of the second delay stage, and the third and fourth control signals match an input to the inverter gate of the first delay stage; and
   the coupling cell applies a negative coupling weight to the connected ring oscillators when the first and second control signals match an inversion of the input to the inverter gate of the second delay stage, and the third and fourth control signals match an inversion of the input to the inverter gate of the first delay stage.

7. The coupled ring oscillator circuit of claim 6, wherein each coupling cell does not apply a weight to the connected ring oscillators when the first and second control signals deactivate the first modified tri-state inverter, and the third and fourth control signals deactivate the second modified tri-state inverter.

8. The coupled ring oscillator circuit of claim 6, wherein:
   the first and second control signals are generated by the second ring oscillator; and
   the third and the fourth control signals are generated by the first ring oscillator.

* * * * *